(12) United States Patent
Mandry

(10) Patent No.: US 7,346,873 B2
(45) Date of Patent: Mar. 18, 2008

(54) CLOCKTREE TUNING SHIMS AND SHIM TUNING METHOD

(75) Inventor: James E. Mandry, North Andover, MA (US)

(73) Assignee: Altera Corporation, San Jose, CA (US)

( * ) Notice: Subject to any disclaimer, the term of this patent is extended or adjusted under 35 U.S.C. 154(b) by 142 days.

(21) Appl. No.: 10/785,829

(22) Filed: Feb. 24, 2004

(65) Prior Publication Data

US 2004/0243957 A1 Dec. 2, 2004

Related U.S. Application Data

(60) Provisional application No. 60/450,076, filed on Feb. 25, 2003, provisional application No. 60/465,089, filed on Apr. 24, 2003.

(51) Int. Cl.
G06F 17/50 (2006.01)
G06F 9/45 (2006.01)

(52) U.S. Cl. .................... 716/6; 716/5; 716/17

(58) Field of Classification Search ............. 716/4–6, 716/9–11, 1, 2, 17, 18; 327/565
See application file for complete search history.

(56) References Cited

U.S. PATENT DOCUMENTS 5,781,766 A * 7/1998 Davis .................. 713/401

| | | | | |
|---|---|---|---|---|
| 6,205,571 B1 * | 3/2001 | Camporese et al. | ........... | 716/2 |
| 6,440,780 B1 * | 8/2002 | Kimura et al. | ........... | 438/129 |
| 6,593,792 B2 * | 7/2003 | Fujii | ........... | 327/276 |
| 6,693,334 B2 * | 2/2004 | Sasaki | ........... | 257/409 |
| 6,880,142 B2 * | 4/2005 | Cui et al. | ........... | 716/6 |
| 2001/0048333 A1 * | 12/2001 | Fujii | ........... | 327/270 |

OTHER PUBLICATIONS

Kourtev, I. and Friedman, E., "Simultaneous Clock Scheduling and Buffered Clock Tree Synthesis", IEEE International Symposium on Circuits and Systems, Jun. 9-12, 1997.

* cited by examiner

Primary Examiner—Jack Chiang
Assistant Examiner—Nghia M. Doan
(74) Attorney, Agent, or Firm—Wilmer, Cutler, Pickering Hale and Dorr LLP

(57) ABSTRACT

A digital storage medium for storing electronic data for use with a clock tree design tool to design a clock distribution network within an integrated circuit. The electronic data implements a library of shim cells, wherein each of the shims cells represents a physical embodiment of a different clock driver cell such that all of the shim cells in the library are interchangeable in the clock distribution design without requiring any change in the placement or routing within the integrated circuit to maintain compliance with design requirements for the integrated circuit. Each cell within a library represents a structure that introduces a particular delay time in the clock signal. The library contains cells having a range of delays that span a range that is sufficiently large to deal with the range of clock skews typically encountered during integrated circuit design.

22 Claims, 2 Drawing Sheets

CLOCKTREE TUNING SHIMS AND SHIM TUNING METHOD

This application claims the benefit of U.S. Provisional Application No. 60/450,076, filed Feb. 25, 2003, and U.S. Provisional Application No. 60/465,089, filed Apr. 24, 2003.

TECHNICAL FIELD

This invention relates to clocktree tuning methods and tools such as might be used in the design of integrated circuits.

BACKGROUND OF THE INVENTION

In the physical implementation of a digital circuit on a chip 10, such as is illustrated in FIG. 1, a network 12 needs to be provided to distribute copies of the clock signal to the clocked components (e.g. registers, flip-flops, latches and other logic devices) or groups of clocked components 14 distributed throughout the circuit. The network that performs this function is referred to as clock distribution network or a clocktree. It is referred to as a tree because of the hierarchical character of its structure, with multiple levels of branching.

In large circuits with many elements, designing the clocktree can be a very challenging part of the overall circuit design process. For example, in a chip that has 700,000 placeable elements, 10% of those elements (i.e., 70,000 elements) may need a copy of the clock signal. Just getting the clock signal to that many elements can be a challenge in itself. Moreover, as the size of the devices has decreased, as the areas of the integrated circuit chips and the component counts have increased, the quality of the distributed clock signal has become one of the primary factors limiting circuit performance.

One challenge in designing a clock distribution network is due in part to the component and interconnect parasitic capacitances and resistances that cause the clock signal that is being distributed throughout the network to experience different delays. So, one set of clocked components located in one area of the circuit may receive the clock signal later than other clocked components elsewhere in the circuit. These differences in the times at which the clock signals reach the various components are referred to as clock timing skews. If excessively large, the skews can cause the circuit to operate improperly or not operate at all. So, the goal of many design processes is to reduce these timing skews to zero or, more practically, to a level that is below some minimum specified target value.

The creation of the clocktree has become a major bottleneck in engineering a large ASIC (Application Specific Integrated Circuit). In current practice, an engineer uses a clocktree synthesis design tool to initially design the clocktree. During this stage, clocktree synthesis is initially performed with buffers and large inverters. After the initial design is completed, the designer, usually with the aid of a timing analysis tool, measures the skews among various locations on the tree at the "worst case" corners. Invariably, the skews are unsatisfactory in some number of the branches of the clocktree and the timing analysis tool identifies those branches. A lengthy and tedious iterative process usually ensues during which various "tweaks" or adjustments in layout, buffers, fanout, etc. are made and the resultant skews measured again. After the skews are made satisfactory at the worst-case corner, "best case" skews must be checked and further iterations often ensue. Frequently this process must be repeated again and again, eventually becoming tedious and exasperating. It is not unusual to reach a point in the clocktree design process at which the clocktree must be removed and the design effort begun anew.

One frequently employed option in the design process is to measure what is referred to as the pre-route timing before the routing is performed. If this is done, timing adjustments are usually made to reduce any timing skews that are excessive. Just as the post routing timing adjustment process is iterative, so is the pre-route timing adjustment process. And similarly this phase can also consume a lot of time.

As the circuits have become larger and more complex, the time required to design the clock distribution network has increased significantly. Indeed, the above-described clocktree trial-and-error process can add a month or more to the project and even then the final result is sometimes so sub-optimum that chip performance must be downgraded.

SUMMARY OF THE INVENTION

The described embodiment facilitates tuning the clocktree, at physical design time, of large integrated circuits to achieve very low skew, or predetermined skews, using components and procedures that can be implemented with minimum trial-and-error. The very low skews, or predetermined skews, which are achieved, can be maintained across chip-to-chip process variations.

In general, in one aspect the invention features a digital storage medium storing electronic data for use with a clock tree design tool to design a clock distribution network within an integrated circuit. The electronic data implements a library of shim cells, wherein each of the shim cells in the library represents a physical embodiment of a different clock driver cell of a plurality of clock driver cells and wherein all of the shim cells in the library are interchangeable in the clock distribution network design without requiring any change in placement or routing within the integrated circuit to maintain compliance with design requirements for the integrated circuit.

Other embodiments include one or more of the following features. All of the shim cells within the library of shim cells have connection areas that are in the same physical locations so that substituting one cell for another one will not require a routing change; are of the same size and shape so that substituting one for another does not require a change in placement of any neighboring components; have the same input capacitance; have the same output characteristics; have the same rise and fall time for the same loading conditions; and have the same arrangement of dummy metal to provide shielding against coupling with signals in neighboring components and wiring.

In general, in another aspect the invention features a method of designing an integrated circuit that includes a clock distribution network. The method involves: providing a shim library containing a plurality of shim cells each of which represents a physical embodiment of a different clock driver cell of a plurality of clock driver cells, and each of which has a different associated specified delay time; using a software design tool to layout an initial design of the integrated circuit including the clock distribution network, wherein the initial design of the clock distribution network includes a placeholder shim cell selected from the shim library; measuring timing skew for the initial design; and substituting selected ones of the plurality of shim cells from the shim library for a selected ones of the placeholder shim cells to adjust timing skew for the integrated circuit, wherein each of the shim cells of the library of shim cells has a set of associated characteristics that enables any one of the shim cells to be substituted for another one of the shim cells in the integrated circuit without substantially altering performance of the initial design other than with regard to measured timing skew.

In general, in still another aspect, the invention features a method of designing an integrated circuit that includes a clock distribution network and that meets a set of specified design requirements. The method involves: providing a shim library containing a plurality of shim cells each of which represents a physical embodiment of a different clock driver cell of a plurality of clock driver cells, and each of which has a different associated specified delay time; using a software design tool to place and route an initial design of the integrated circuit including the clock distribution network, wherein the initial design of the clock distribution network includes a placeholder shim cell selected from the shim library and meets the set of specified design requirements; measuring timing skew for the initial design; and substituting selected ones of the plurality of shim cells from the shim library for a selected ones of the placeholder shim cells to adjust timing skew for the integrated circuit, wherein each of the shim cells of the library of shim cells has a set of associated characteristics that enables any one of the shim cells to be substituted for another one of the shim cells in the integrated circuit without having to change routing or placement of any other components within the integrated circuit to meet the design requirements for the integrated circuit.

In general, in still yet another aspect the invention features a method of designing an integrated circuit that includes a clock distribution network and that meets a set of specified design requirements. The method involves: using a software design tool to place and route an initial design of the integrated circuit including the clock distribution network, wherein the initial design of the clock distribution network includes a plurality of placeholder shim cells placed at various different locations within the clock signal distribution network, each of the placeholder cells is characterized by a corresponding clock signal timing delay and represents a corresponding clock driver cell that is to be fabricated into the integrated circuit; measuring timing skew for the initial design; and replacing appropriate ones of the plurality of placeholder cells with a different cell having a different associated delay time to adjust a timing skew of an associated part of the clock signal distribution circuit, wherein each of the different cells has a set of associated characteristics that enables it to be substituted for any placeholder cell in the integrated circuit without having to change routing or placement of any other components within the integrated circuit to meet the design requirements for the integrated circuit.

A key advantage of the shims in the library is that they are completely interchangeable within the circuit and in the design without significantly affecting aspects of the circuit performance—more importantly, generally without requiring either a change in the layout of the circuit or of the routing.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
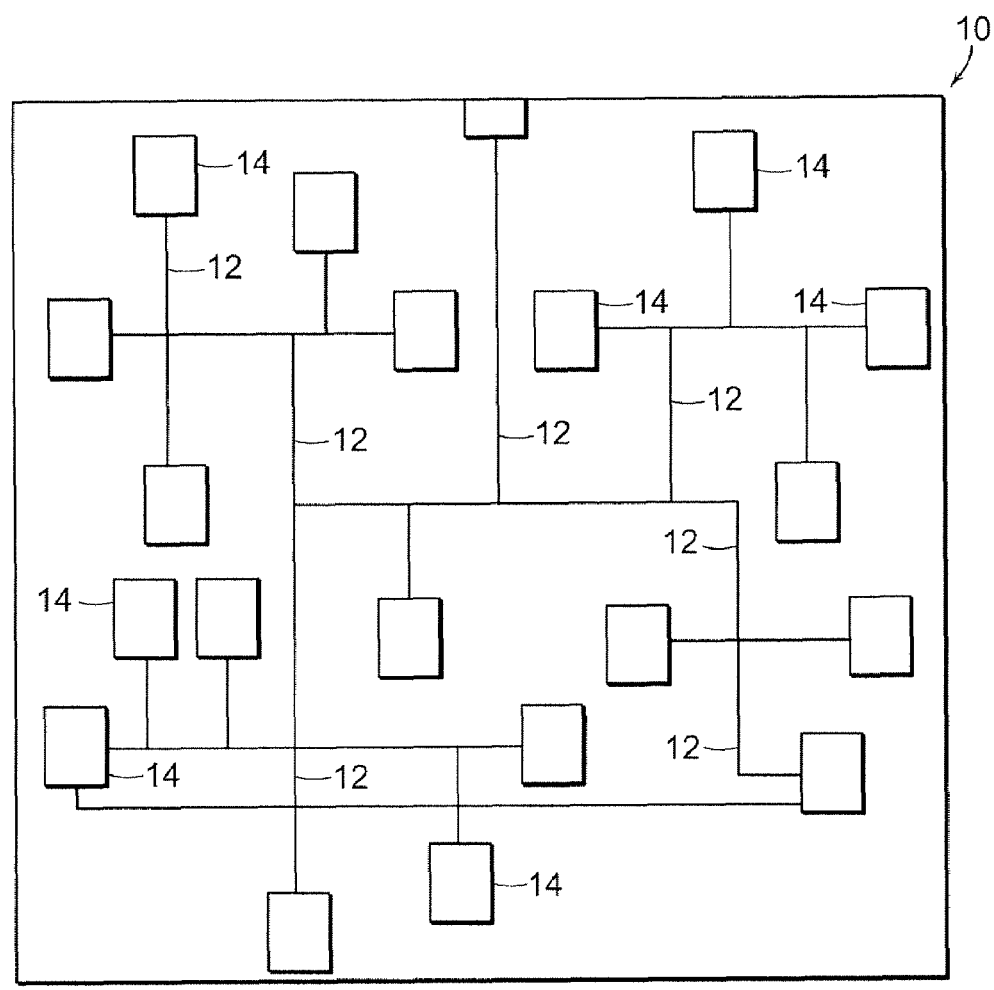
FIG. 1 is a schematic diagram of a representative integrated circuit chip with a clocktree.

One concept that underlies many of the embodiments described or mentioned herein is a library of custom shim cells that is used by the clocktree synthesis tool to design and layout the clock distribution network. Each custom shim cell in the library is the model for or represents a corresponding structure in the circuit and that structure is an active delay element that introduces a different corresponding delay time in the clock signal. Each shim is denominated in units that readily correspond to the delay that is introduced by the physical embodiment that it represents, i.e., the particular active delay element. The complete library of available delay times spans a range that is sufficiently large to deal with the range of clock skews that the designer will likely encounter in the design process. Moreover, the complete set of available delays is sufficiently finely graded to provide the degree of fine-tuning that the designer requires during the design process. Thus, by substituting one shim cell for another in the clock distribution network, the circuit designer can adjust the resulting clock delay in any affected branch of a clock distribution network by any amount within that range. In addition, the shim cells in the library all share the characteristic that any cell that is used in the design of the circuit may be replaced by any other shim cell from the library without requiring any further changes to the existing placement and routing. That is, the substitutions do not force the designer to go through further iterations with the design tool to account for changes with in the circuit that are caused by the substitutions. The only impact that the substitutions have on the performance of the particular circuit design layout is on the clock skews.

In essence, the library of cells is equivalent to a single shim cell that has a tunable delay. During the design process, representative members of the library (e.g. cells having an associated delay that falls near the center of all of the available delays) are intelligently inserted into various branches of the clock distribution network as placeholders. The placeholder can be a single, representative member of the library or a small number of selected members of the library.

After the initial design is completed by the design tool, including the placement of all components and the routing of all interconnects, the designer measures the clock skews in the circuit. If those measurements indicate that the delays in certain branches need to be adjusted, then the designer simply substitutes the appropriate shim cells from the shim library for the placeholder cells within those branches to zero out the measured skews.

It should be immediately apparent that the availability of such a library of clock driver cells greatly simplifies the process of designing a clock distribution network that meets the requirements of the particular circuit. The library enables the circuit designer to avoid the usually very time consuming, sometimes very expensive, and often very frustrating iterative process that has been required in the past.

The underlying device structures that are represented by the shim cells are designed to satisfy a number of different requirements so that they will indeed be completely interchangeable within the circuit without impacting circuit performance, other than clock delay. Some of the key features of the external design of the structures include the size and shape of the cells, the contact locations, and the usage of dummy metal layers for shielding. Each of these is will be discussed in greater detail.

In the described embodiment, the structures that implement the shim cells in a particular library all have the same physical size and shape. Having the same physical size and shape means that the outer dimensions of the structures representing the different shims (i.e., the areas that the different cells occupy within the actual integrated circuit) are identical. Thus, if one shim cell is later substituted for another shim cell to adjust clock skew, there will always be sufficient space to receive the new shim cell in the existing circuit layout; nothing else will have to be moved to make room for the replacement shim cell. If the sizes or shapes of the shim cells within the library were not the same, then an attempt to substitute a larger shim cell for a smaller shim cell would mean that other elements in the circuit would have to be moved to accommodate the new shim cell. And that would result in having to change the layout of the circuit requiring further iterations with the design tools.

In this case, the size and shape of the structure simply refers to the amount of space that is "assigned" to the shim cell in the layout. It represents space that cannot be used by other neighboring components. It does not necessarily refer to only the amount of physical space required by the inverters and capacitive elements that are used to implement the delay cell.

One could imagine circumstances in which the identical size and shape requirement could be relaxed without creating a problem in the design process so long as the later substitutions that might need to be considered did not require that a larger shim cell be substituted for a smaller shim cell. Thus, for example, if the placeholder shim cells are designed to be the larger cells, then a later substitution of another shim cell would not present a problem due to lack of available space for the new cell.

Besides being of equal size and shape, cell structures also have their connection areas located in the same locations from one cell to the next. The connection areas are the areas to which electrical connections are made, usually by metal that comes down from above. Typically, the structure that implements the shim cell will include metal 1, metal 2, and metal 3 metalizations; whereas the metal connecting the cell into the circuit comes from a higher-level metalization. To reach the connection areas, a later formed (or higher level) metallization connects to the connection area through an appropriately placed via that is formed in the oxide or dielectric layers that extend over the cell. To satisfy the requirement that the shim cells are completely interchangeable, all of the shim cells in the library have their connection area at the same physical locations. So, when one cell is substituted for another one, it is not necessary to relocate the vias through which connections are made to that cell.

All shim cells in the described embodiment also have matched input characteristics. In other words, the input impedance and capacitance of all cells are the same. Thus, to the upstream circuitry that delivers a signal to the shim cell, all shim cells impose the same amount of loading. If this were not the case and if the loading changed when the shim cell changed, then that would likely alter the electrical performance of the upstream circuitry which would in turn necessitate further iterations with the design tools to correct for those changes.

Similarly, all shim cells have matched output characteristics (e.g. the rise/fall time for a given load). Thus, if one cell is substituted for another in the clocktree it will have no effect further out in the clocktree, except for introducing the desired time delay.

To further ensure interchangeability, the shim cells are shielded by appropriately placed dummy metal to isolate the cell from the effects of signals in other metal lines that are routed near the cell in the circuit. The dummy metal is implemented, for example, by a metal 3 metalization. Typically, the dummy metallization will cover large areas of the shim cell structure and serves to shield underlying circuitry within the cell from capacitively coupling to signals in lines running close to or above the cell. It also serves to present identical parasitic capacitance to adjacent circuitry. SPICE simulations can be used to determine the size and placement of the dummy metal.

In summary, the shim cells within the above-described library have the following characteristics:

(1) they span a sufficiently broad range of delay deltas to accommodate anticipated skews in timing;
(2) they form a sufficiently finely graded set;
(3) they do not vary in physical size and/or shape from one to another;
(4) they do not vary in electrical connection area locations from one to another;
(5) they do not vary in their parasitic capacitances to adjacent circuit elements;
(6) they do not vary in their input capacitances from one to another;
(7) they do not vary in their output rise/fall times from one to another;
(8) they are denominated in units that readily correspond to the measured skew; and
(9) they include shielding elements to minimize cross talk and increase accuracy.

An example of what might constitute a sufficiently broad and sufficiently finely graded set of shim cells is a shim library that includes 101 cells spaced at 10 ps worst-case units. Worst-case units, i.e. representing the slow-slow corner of the process, are used because skew measurements are normally in those units. The library spans a range of 1 nanosecond worst-case. The "center" cell is labeled with a delay of 0 picoseconds and is used as the placeholder for the first-pass clocktree layout. The fifty cells with greater delays would have positive delay designations, and the fifty cells with lesser delays negative delay designations.

Of course, it is not necessary the delays be equally spaced so long as the set of available shim cells adequately covers the range of timing skews that might be observed during the design process. It is also not required that a cell in the center of the range be selected as the placeholder cell. The key requirement here is that there is sufficient room to adjust skew on either side of the placeholder cell to accommodate the skews that one might expect to see during the design process. Indeed, it might be better to select a placeholder cell that is somewhat closer to the minimum skew that one expects to encounter thereby giving a greater range of control on the high side.

In most design scenarios, it is desirable that the cells in the library track process variations in the same manner as other devices in the circuit. In fact, the shim cells will naturally tend to track process variations if the underlying devices used to implement the cells are fabricated using the same processes and design rules as those used to fabricate the other devices in the circuit.

But in order to achieve true process tracking, a selected shim cell must separately and independently meet desired insertion delays at each process corner for the actual load the shim will see in the circuit. At minimum there are two process corners, referred to as "worst-case" (meaning slowest) and "best case" (meaning fastest). Other corners may be considered and examined in very critical applications. The set of shim cells therefore should be multi-dimensional, i.e., multiple shim cells characterized over multiple process corners.

In addition, to minimize shim insertion delay, the selection of a particular shim cell to achieve a desired shift in skew will be a function of the type of loading. For example, there is a difference between active loading (i.e., gate loading) versus passive loading (i.e., metal loading). So, to construct an even more complete library of shim cells one could also include groups of shim cells with each group representing a specific desired delay. In a group, each shim cell would be associated with a different type of loading and loading condition.

It also may be desirable, however, to include a library of cells that deviate as little as possible a function of process, voltage, and temperature (PVT). Such cells can be readily designed by employing known techniques including appropriately selecting transistor channel lengths, channel widths, and other device parameters, including even the orientation of the devices within the silicon relative to the other devices. By making the channels wider, for example, variations in the precise locations of the edge of the channels due to variations in resolution during the fabrication process will have a smaller relative affect on the channel width.

Still another potentially useful way of distinguishing among the shim cells is by drive strength. That is, it might be useful in some design situations to have different sets of shim cells for different required or desired drive strengths. So, the replacement shim cell would be selected from the appropriate set based on the drive that is required at the particular point in the circuit where it will be placed.

Thus, an even more sophisticated version of the embodiment described above would include multiple libraries, each with a full set of shim cells for a particular loading condition characterized over multiple process corners. And among those libraries would be one or more libraries for cell designs that track process well so that as characteristics of other elements change, their characteristics change in a similar manner and one or more libraries for cell designs that deviate little as possible as a function of PVT.

Of course, how the shim cells are organized is not of particular importance so long as the range of options are effectively made available to the designer. So, instead, of using separate libraries for each set of conditions, one could instead use a single library in which there are groups of shim cells, each group for an associated delay delta. And within each group there would be a shim cell for the different loading, etc. Either approach could be used to represent the multidimensional character of the underlying shim cells.

In practice, however, even the more simplistic approach of using a single library that includes only one set of shims would be a major improvement over what has previously existed. Moreover, that approach has the advantage that the total number of shim cells would be much more manageable and could be easily provided in the form be a pre-computed library. Later, if more corners or increased accuracy are required, the shims can be generated by the clocktree tool on-the-fly, in which case the total number of possible shims could be arbitrarily large.

Figure 2:
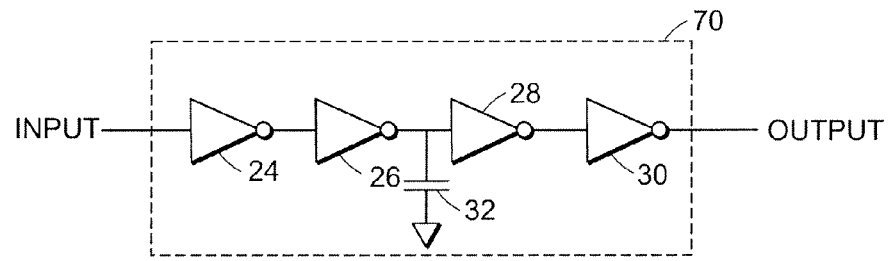
FIG. 2 is a schematic diagram of a non-inverting clock driver.

In the described embodiment, a clock driver cell 20 that implements the shim cell is shown in FIG. 2. It is an active device, as contrasted to a passive element such as a capacitor, and includes four inverters, namely an input inverter 24, two internal inverters 26 and 28, and an output inverter 30, all connected in series. It also includes an internal element that implements a capacitance 32 the adjustment of which can be used to help set the delay delta associated with the cell. The input inverter establishes the input characteristics of the cell and the output inverter establishes the drive capabilities of the cell. The input and output inverters guarantee that the relevant input and output characteristics will be identical from cell to cell in the library. The inverters inside the cell along with the capacitance are used to increase/decrease the delay delta associated with the cell. Since the internal mechanisms for setting the delay delta for this shim cell from the outside circuitry to which the shim cell will connect are isolated by the input and output inverters, the delays can be more easily changed from one cell to the next without affecting the input and output characteristics of the cell. That is, the delay delta can be adjusted independently of the input and output characteristics of the shim cell.

Figure 3:
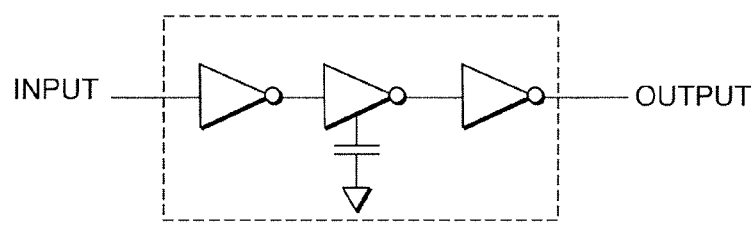
FIG. 3 is a schematic diagram of an inverting clock driver.

The shim cell illustrated in FIG. 2 is a non-inverting type because it has an even number of inverters within it. Inverting type shim cells will have an odd number of inverters in them, such as the cell illustrated in FIG. 3.

Theoretically, the shim cell can include more than four inverters. But using more inverters within the cell implies using more space for implementing the cell. From the designer's point of view that is probably undesirable. So, as a practical matter the three and four inverter cells are probably the preferred designs.

It is, of course, also possible to implement a non-inverting cell with only two inverters. However, with the smaller number of inverters, designing cells whose input and output characteristics do not vary from cell to cell presents a greater challenge. This is because the internal changes that are required to implement a different delay deltas will tend to also impact the input and output characteristics of the cell. That is because there are a limited number of parameters that can be adjusted and the parameter set which affects delay delta also impacts other electrical characteristics of the circuit which are relevant to whether the cell is interchangeable with another cell, e.g. input capacitance, rise and fall time, etc. As a consequence, implementing a different delay delta will not be a simple matter of adjusting a few internal parameter of the cell but will also require changing parameters within the input and output inverters. In short, the three and four inverter designs are likely to be viewed as easier to implement.

Figure 4:
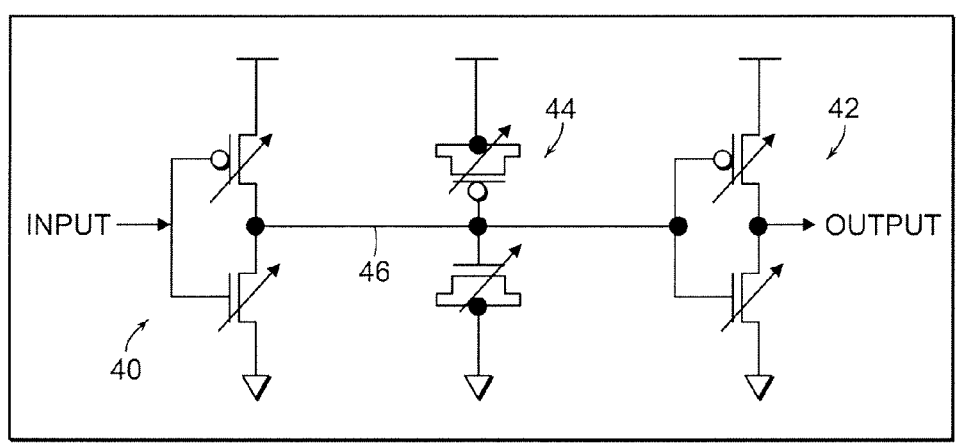
FIG. 4 is a schematic diagram of a two-inverter clock driver.

Nevertheless, one could use a two-inverter shim cell if one is also willing to accept the greater complexity of using such a structure. An example of a generic process-tracking two inverter shim cell design is presented in FIG. 4. It includes an input inverter 40, an output inverter 42, and an internal circuitry 44 used to adjust the delay delta associated with the cell. In this example, each of the inverters and the internal circuitry is implemented by a combination of n-type and a p-type MOS devices. In internal circuitry 44, each of MOS devices has its source and drain terminals connected together to implement capacitive elements. The diagonal arrows indicate components that are varied from one shim to another. The interconnect metal 46 on the center node can be increased to add capacitance. The internal capacitance can be controlled by varying the length and width of the channels in the internal MOS devices as well as by changing the length and layout of the internal wiring. (Such techniques could also be employed to create and adjust capacitances in the cells shown in FIGS. 2 and 3.)

For a given load seen by the shim, as measured by the timing tool at each process corner in the actual circuit, a shim may be designed within this paradigm to:

(a) have nearly identical input capacitance at each corner as the placeholder shim;

(b) have nearly identical rise/fall time at each corner as the placeholder shim; and (c) differ in delay from the placeholder shim by a desired amount, positive or negative, at each process corner.

As is the case in all approaches discussed thus far, the desired amounts of delay are selected either to minimize overall clock skew at all corners or to set clock skews to small but controlled amounts (e.g. to ameliorate power supply transients). In some cases having all of the clock edges throughout the chip line up exactly may significantly increase the powerload and thus it might be desirable to distribute the clock edges over a small range about the ideal time.

As suggested previously, the various dimensions of desired behavior listed above do not map in any simple way onto the available degrees-of-freedom designated by the diagonal arrows in the diagram. There is necessarily a set of simultaneous equations to be solved. This computation may be simplified by using linearized equations and two or three iterations. These are not iterations in the clocktree layout, but rather could be performed transparently by the tool in the process of dynamically generating a single shim for a given point in the clocktree. If the total number of shims is small enough to be a pre-computed library, then the library can be organized according to the desired skew properties rather than the internal variables.

Yet, another approach is to use a shim cell design that represents a clock driver cell that can be modified in-situ to alter the delay delta associated with the cell without altering any other characteristics of the cell that would necessitate a change in placement or chip-level routing in the initial circuit design. In that case, there would be only one cell in the library and that cell would have a selectable delay delta.

A high level description of the process for using a software implemented design tools to design a clocktree will now be presented. Central to this process is a clock tree synthesizer. Typically, the clock tree synthesizer is a part of a place and route tool that is used by the designer to layout the chip. How that functionality is grouped within the different commercially available design tool suites, however, varies from one manufacturer to another.

Using other tools the designer comes up with the logic and circuit design that is to be laid out. This design, along with a specification of the technology that is to be used (e.g. CMOS) as well as other design constraints are read into a place and route tool, such as the Astro™ tool that is commercially available from Synopsys, Inc. Among the information provided to the tools is information about the shim cell library.

In the described embodiment, each shim cell is represented by one or more electronic files stored in memory and/or data storage that is accessible to the design tools. The files provide information about the corresponding shim cell that will be needed by the design tools during the layout, placement, and timing measurement processes. For example, the file (or files) specifies the characteristics of the shim cell including, for example, its physical size and shape, connection area placements, a circuit diagram, and associated time delays for a range of input and output conditions. Each shim cell has those characteristics associated with it and represents a physical embodiment in the integrated circuit that also has those characteristics.

Once the required information has been provided to the tool, a timing-driven placement algorithm within the tool places the design. This involves placing the clocked components and inserting the clock tree into the design. During this phase, the tool also inserts the placeholder shim cells into branches of the clocktree at appropriate locations. The locations can be left up to the design tool itself or the designer can impose a number of constraints on where such placeholders can be inserted, both physically and hierarchically (i.e., logically).

When the initial placement is completed, the tool then routes the electrical wiring (i.e., metalizations) to interconnect the modules and components that have been placed. To perform these functions it imposes the design constraints that were previously specified by the designer. In carrying out this phase of the design, it sometimes proves necessary to modify the initial placement that was proposed during the earlier phase of the design process in order to achieve the overall design objectives. In other words, the place and route process can be an interative process.

After the components and the clock tree has been placed and routed, the designer uses a timing measurement tool to evaluate how close the initial design came to the requirements for the design. If there proves to be timing problems, i.e., excessive skews, the shims are used to correct the skews. This is the point at which the value of the shim cells becomes most apparent. To correct the timing in any particular branch, the appropriate shim cell that yields the desired delta in clock timing is inserted into the circuit in place of the placeholder cell that was designed into the circuit during the earlier design phase. Because the shim cells are completely interchangeable in the manner that was described above, the adjustments made at this point will not necessitate a change in the layout or placement of any components or a rerouting of any metal.

If a chip involves a large number of shim locations, an automated tool or tool-driving script, for example in the Scheme language for the Synopsys layout tools, would select and place the required shim cells based on automated skew measurements. Since a shim's load at each process corner is necessarily known to the timing tool checking the skews, this process can be entirely automated. However, if the number of shim points is small, hand selection and placement could also be used.

In many current commercially available design tools, the user will need to run a special command during this phase that instructs the tool to make the shim cell substitutions without changing anything else. This is very important because current commercially available tools are not designed to use a shim cell library of the type described herein. In the Synopsis layout tool, for example, the command sequence would be 'auECOByChangeFile' followed by 'axgECORoute Design'. Parameters associated with the command sequence have to also be properly assigned to insure the logical connectivity of the design database is updated to reflect the connectivity to the new shim cell, but no cell placement or physical routing alterations will occur.

With the shims available from the shim cell library, it will be possible to achieve timing closure without having to rerun the layout and placement tool to fix problems caused by adjustments that were made to the clocktree.

Various approaches can be used to optimize the design process. For example, the commercially available design tools today can totally auto-generate the clock tree. But it may be preferable for the designer to seed the design process with a simple initial design of a clocktree upon which the design tool would construct the complete design. Alternatively, the design tool could be constrained with regard to where the placeholder cells can be located. Experience suggests that the optimum location for the placeholder shim cells is usually midway out the clock distribution tree at intermediate depths or levels. Instructing the design tool to limit its use of placeholder shim cells to those regions of the design could improve the resulting initial design as well as speed the process of arriving at that initial design. The designer might also want to limit the number of levels (i.e., the depth) that would be permitted in the resulting design of the clocktree. Such constraints and initial designs can be easily provided to the tool through appropriately written scripts.

Still another approach would be to insert the placeholder clock driver cells into the in logic circuit design that is provided to the tool. This would provide an effective way to control where the shim cells are placed logically.

Yet another approach would be to use different groups of shims cells, each group of which has a different granularity of delay delta. Thus for example, one group would permit only coarse corrections in delay; a second group might offer medium corrections in delay; and a third group might offer fine corrections in timing. If such an approach is used, the design tool would be constrained to use the first group of shim cells only in higher levels of the clocktree, the second group of shim cells at middle layers of the clocktree, and the third group of shim cells out near the leaf nodes of the clocktree.

Still other embodiments are within the following claims. For example, the library could be implemented as a single shim cell that has a tunable delay, which is adjustable after the shim cell is in the circuit. The adjustable shim cell, with a specified delay delta of zero, would be put into the circuit at the placeholder locations. Once the timing skews for the initial design are known, the delay delta associated with each of the placeholder shim cells can be adjusted appropriately.

In addition, the individual shim cells could be generated on-the-fly by computing the particular parameters of the shim cell that are needed to provide a desired amount of delay delta. This would of course require greater computational capabilities be present within the design tool. But it has the advantage of being able to implement a very comprehensive and sophisticated library which is precomputed that would otherwise require a tremendous amount of storage space to contain.

What is claimed is:

1. An article of manufacture comprising a digital storage medium storing electronic data for use with a clock tree design tool to design a clock distribution network within an integrated circuit, said electronic data implementing a library of shim cells, wherein each of said shim cells in the library represents a physical embodiment of a different clock driver cell of a plurality of clock driver cells and wherein all of the shim cells in the library are substitutable one for another in the clock distribution network design without requiring any change in placement or routing within the integrated circuit to maintain compliance with design requirements for the integrated circuit, wherein all of the shim cells within the library of shim cells have the same arrangement of dummy metal to provide shielding against coupling with signals in neighboring components and wiring.

2. The article of manufacture of claim 1 wherein all of the shim cells within the library of shim cells are process tracking.

3. A method of designing an integrated circuit that includes a clock distribution network, said method comprising:
providing a shim library containing a plurality of shim cells each of which represents a physical embodiment of a different clock driver cell of a plurality of clock driver cells, and each of which has a different associated specified delay time;
using a software design tool to layout an initial design of the integrated circuit including the clock distribution network, wherein the initial design of the clock distribution network includes a placeholder shim cell selected from the shim library;
measuring timing skew for the initial design; and
substituting selected ones of the plurality of shim cells from the shim library for selected ones of the placeholder shim cells to adjust timing skew for the integrated circuit, wherein each of the shim cells of the library of shim cells has a set of associated characteristics that enables any one of the shim cells to be substituted for another one of the shim cells in the integrated circuit without substantially altering performance of the initial design other than with regard to measured timing skew, wherein all of the shim cells within the library of shim cells have the same arrangement of dummy metal to provide shielding against coupling with signals in neighboring components and wiring.

4. The method of claim 3 wherein all of the shim cells within the library of shim cells are process tracking.

5. A method of designing an integrated circuit that includes a clock distribution network and that meets a set of specified design requirements, said method comprising:
providing a shim library containing a plurality of shim cells each of which represents a physical embodiment of a different clock driver cell of a plurality of clock driver cells, and each of which has a different associated specified delay time;
using a software design tool to place and route an initial design of the integrated circuit including the clock distribution network, wherein the initial design of the clock distribution network includes a placeholder shim cell selected from the shim library and meets the set of specified design requirements;
measuring timing skew for the initial design; and
substituting selected ones of the plurality of shim cells from the shim library for selected ones of the placeholder shim cells to adjust timing skew for the integrated circuit, wherein each of the shim cells of the library of shim cells has a set of associated characteristics that enables any one of the shim cells to be substituted for another one of the shim cells in the integrated circuit without having to change routing or placement of any other components within the integrated circuit to meet the design requirements for the integrated circuit and wherein all of the shim cells within the library of shim cells are process tracking.

6. An article of manufacture comprising a digital storage medium storing electronic data for use with a clock tree design tool to design a clock distribution network within an integrated circuit, said electronic data implementing a library of shim cells, wherein each of said shim cells in the library represents a physical embodiment of a different clock driver cell of a plurality of clock driver cells and wherein all of the shim cells in the library are substitutable one for another in the clock distribution network design without requiring any change in placement or routing within the integrated circuit to maintain compliance with design requirements for the integrated circuit, wherein all of the shim cells within the library of shim cells are process tracking.

7. The article of manufacture of claim 6 wherein said electronic data implements a plurality of libraries of shim cells, said first-mentioned library of shim cells being one of said plurality of libraries of shim cells, and wherein each library of said plurality of libraries corresponds to a different external drive strength.

8. An article of manufacture comprising a digital storage medium storing electronic data for use with a clock tree design tool to design a clock distribution network within an integrated circuit, said electronic data implementing a library of shim cells, wherein each of said shim cells in the library represents a physical embodiment of a different clock driver cell of a plurality of clock driver cells and wherein all of the shim cells in the library are substitutable one for another in the clock distribution network design without requiring any change in placement or routing within the integrated circuit to maintain compliance with design requirements for the integrated circuit, wherein said electronic data implements a plurality of libraries of shim cells, said first-mentioned library of shim cells being one of said plurality of libraries of shim cells, and wherein each library of said plurality of libraries corresponds to a different external drive strength.

9. The article of manufacture of claim 8 wherein all of the shim cells within the library of shim cells have connection areas that are in the same physical locations so that substituting one shim cell for any other shim cell will not require a routing change.

10. The article of manufacture of claim 8 wherein all of the shim cells within the library of shim cells are of the same size and shape so that substituting one for another does not require a change in placement of any neighboring components.

11. The article of manufacture of claim 8 wherein all of the shim cells within the library of shim cells have the same input capacitance.

12. The article of manufacture of claim 8 wherein all of the shim cells within the library of shim cells have the same output characteristics.

13. The article of manufacture of claim 8 wherein all of the shim cells within the library of shim cells have the same rise and fall time for the same loading conditions.

14. The article of manufacture of claim 8 wherein all of the shim cells within the library of shim cells have the same arrangement of dummy metal to provide shielding against coupling with signals in neighboring components and wiring.

15. A method of designing an integrated circuit that includes a clock distribution network, said method comprising:

providing a shim library containing a plurality of shim cells each of which represents a physical embodiment of a different clock driver cell of a plurality of clock driver cells, and each of which has a different associated specified delay time;

using a software design tool to layout an initial design of the integrated circuit including the clock distribution network, wherein the initial design of the clock distribution network includes a placeholder shim cell selected from the shim library;

measuring timing skew for the initial design; and substituting selected ones of the plurality of shim cells from the shim library for selected ones of the placeholder shim cells to adjust timing skew for the integrated circuit, wherein each of the shim cells of the library of shim cells has a set of associated characteristics that enables any one of the shim cells to be substituted for another one of the shim cells in the integrated circuit without substantially altering performance of the initial design other than with regard to measured timing skew, and wherein all of the shim cells within the library of shim cells are process tracking.

16. The method of claim 15 wherein all of the shim cells within the library of shim cells have connection areas that are in the same physical locations so that substituting one shim cell for any other shim cell will not require a routing change.

17. The method of claim 15 wherein all of the shim cells within the library of shim cells are of the same size and shape so that substituting one for another does not require a change in placement of any neighboring components.

18. The method of claim 15 wherein all of the shim cells within the library of shim cells have the same input capacitance.

19. The method of claim 15 wherein all of the shim cells within the library of shim cells have the same output characteristics.

20. The method of claim 15 wherein all of the shim cells within the library of shim cells have the same rise and fall time for the same loading conditions.

21. The method of claim 15 wherein all of the shim cells within the library of shim cells have the same arrangement of dummy metal to provide shielding against coupling with signals in neighboring components and wiring.

22. The method of claim 15 wherein said electronic data implements a plurality of libraries of shim cells, said first-mentioned library of shim cells being one of said plurality of libraries of shim cells, and wherein each library of said plurality of libraries corresponds to a different external drive strength.

* * * * *